(12) United States Patent
Kakinuma et al.

(10) Patent No.: US 12,230,520 B2
(45) Date of Patent: Feb. 18, 2025

(54) PROTECTIVE COMPONENT FORMING APPARATUS

(71) Applicant: DISCO CORPORATION, Tokyo (JP)

(72) Inventors: Yoshinori Kakinuma, Tokyo (JP); Yoshikuni Migiyama, Tokyo (JP); Makoto Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 652 days.

(21) Appl. No.: 17/360,656

(22) Filed: Jun. 28, 2021

(65) Prior Publication Data

US 2022/0020607 A1    Jan. 20, 2022

(30) Foreign Application Priority Data

Jul. 15, 2020 (JP) ................................ 2020-121641

(51) Int. Cl.
*H01L 21/67* (2006.01)
*H01L 21/683* (2006.01)

(52) U.S. Cl.
CPC .... *H01L 21/6715* (2013.01); *H01L 21/67132* (2013.01); *H01L 21/67253* (2013.01); *H01L 21/6836* (2013.01); *H01L 2221/68327* (2013.01)

(58) Field of Classification Search
CPC ........... H01L 21/6715; H01L 21/67132; H01L 21/67253; H01L 21/6836; H01L 2221/68327; H01L 2221/6834; H01L 21/67092; H01L 21/67115; H01L 21/6835
See application file for complete search history.

(56) References Cited

U.S. PATENT DOCUMENTS

| | | | | |
|---|---|---|---|---|
| 3,415,118 A | * | 12/1968 | McQueen | G01F 1/00 73/290 R |
| 2011/0257788 A1 | * | 10/2011 | Wiemers | C02F 1/463 700/271 |
| 2013/0283929 A1 | * | 10/2013 | Ando | G01F 1/66 73/861.27 |
| 2016/0326960 A1 | * | 11/2016 | Baladi | F01D 11/24 |
| 2018/0306619 A1 | * | 10/2018 | Uenodan | G01F 5/00 |
| 2019/0204029 A1 | * | 7/2019 | Tanabe | H01L 21/67253 |

FOREIGN PATENT DOCUMENTS

| | | |
|---|---|---|
| JP | 2013248544 A | 12/2013 |
| JP | 2017050536 A | 3/2017 |
| JP | 2017168565 A | 9/2017 |

OTHER PUBLICATIONS

Machine Translation of JP 2013-248544 (Year: 2013).*
Search Report issued in counterpart Singapore patent application No. 10202106734U, dated Aug. 12, 2022.

* cited by examiner

*Primary Examiner* — George R Koch
*Assistant Examiner* — Christopher C Caillouet
(74) *Attorney, Agent, or Firm* — GREER BURNS & CRAIN, LTD.

(57) ABSTRACT

A protective component forming apparatus includes a chuck table, a resin supply unit having a pump and a pipe that supply a liquid resin from a tank to a resin sheet held by the chuck table, a pressing unit that presses a workpiece against the liquid resin supplied to the resin sheet held by the chuck table, a curing unit that irradiates the liquid resin pressed by the pressing unit with ultraviolet and cures the liquid resin, a resin inspecting part that senses the viscosity of the liquid resin, and an informing unit.

7 Claims, 5 Drawing Sheets

PROTECTIVE COMPONENT FORMING APPARATUS

BACKGROUND OF THE INVENTION

Field of the Invention

The present invention relates to a protective component forming apparatus.

Description of the Related Art

In the process of manufacturing semiconductor device chips or various electronic parts, there are steps of thinning a plate-shaped workpiece such as a wafer on which various devices are formed and dividing the workpiece into chips. The workpiece is processed while being held by a chuck table. At this time, in order to prevent the workpiece from breaking, the front surface of the workpiece is stuck to a resin sheet such as an adhesive tape or a substrate and is protected.

For example, in a case of a workpiece on which recesses and protrusions such as metal electrode bumps exist on the front surface, it is difficult to stick an adhesive tape with the adhesive tape brought into close contact with the recesses and protrusions, processing dust or a processing liquid enters gaps, and the adhesive tape is easily separated. Moreover, the adhesive tape cannot sufficiently absorb the recesses and protrusions. Therefore, there is a problem that the recesses and protrusions are transferred to the workpiece when the workpiece is ground to be thinned.

Thus, a processing method in which a liquid resin cured by an external stimulus such as ultraviolet is flatly stacked and is used as a protective component has been devised (for example, refer to Japanese Patent No. 6312343 and Japanese Patent Laid-open No. 2017-168565).

SUMMARY OF THE INVENTION

However, the liquid resin used in the processing method in the above-described Japanese Patent No. 6312343 and Japanese Patent Laid-open No. 2017-168565 easily deteriorates (changes) depending on the storage method (storage temperature and the number of storage days). When the liquid resin that has deteriorated is used, a desired fixing force is not obtained in some cases.

In particular, when the liquid resin solidifies in storage, a desired amount of the liquid resin is not supplied to the front surface of a workpiece. Thus, the case in which it becomes impossible to coat the whole of the front surface of the workpiece occurs and the case in which it becomes impossible to stack the liquid resin with a desired thickness occurs. As above, the liquid resin used in the processing method in the above-described Japanese Patent No. 6312343 and Japanese Patent Laid-open No. 2017-168565 often causes trouble when being stacked on a workpiece due to deterioration. However, it is difficult to notice change in the liquid resin through only seeing the liquid resin.

Thus, an object of the present invention is to provide a protective component forming apparatus that can suppress trouble at the time of stacking of a protective component configured through stacking a liquid resin.

In accordance with an aspect of the present invention, there is provided a protective component forming apparatus that forms a layer of a resin with a desired thickness on one surface of a plate-shaped workpiece. The protective component forming apparatus includes a chuck table that holds the workpiece with the interposition of a sheet, a tank that stores a liquid resin cured by an external stimulus, a resin supply unit having a pump and a pipe that supply the liquid resin from the tank to the sheet held by the chuck table, and a pressing unit that causes the one surface of the workpiece to face the liquid resin supplied to one surface of the sheet held by the chuck table and presses the workpiece. The protective component forming apparatus also includes a curing unit that gives the external stimulus to the liquid resin pressed by the pressing unit and cures the liquid resin, a resin inspecting part that senses change in viscosity of the liquid resin in association with change in quality of the liquid resin, and an informing unit that transmits information to an operator. The resin inspecting part measures the flow rate of the liquid resin that flows in the pipe by the pump or a load applied to the pressing unit that presses the liquid resin. When a measurement value is outside an allowable range set in advance, the resin inspecting part informs that the measurement value is outside the allowable range by the informing unit.

The present invention provides an effect that trouble at the time of stacking of a protective component configured through stacking the liquid resin can be suppressed.

The above and other objects, features and advantages of the present invention and the manner of realizing them will become more apparent, and the invention itself will best be understood from a study of the following description and an appended claim with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not limited by contents described in the following embodiments. Furthermore, what can be easily envisaged by those skilled in the art and what are substantially the same are included in constituent elements described below. Moreover, configurations described below can be combined as appropriate. In addition, various kinds of omission, replacement, or change of a configuration can be executed without departing from the gist of the present invention.

First Embodiment

Figure 1:
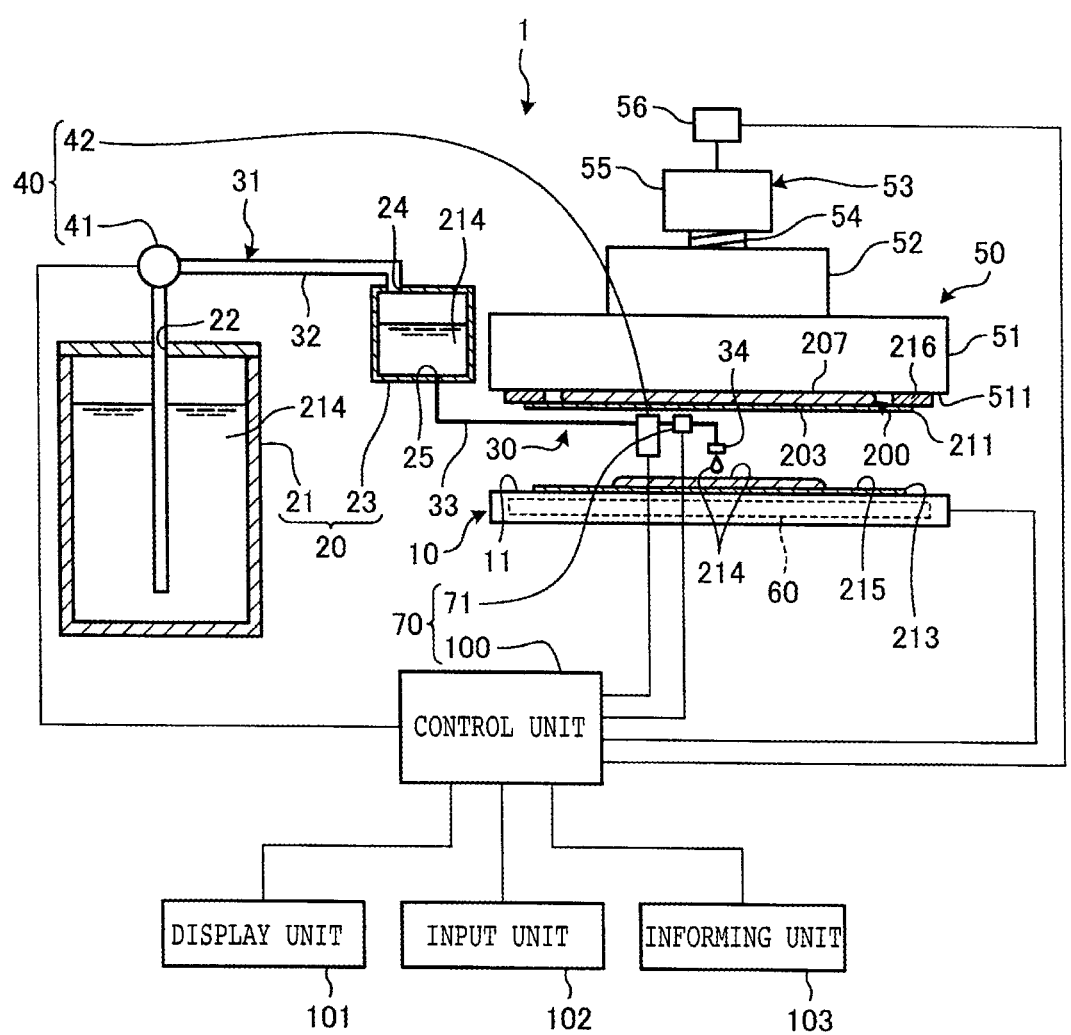
FIG. 1 is a partial sectional side view schematically illustrating a configuration example of a protective component forming apparatus according to a first embodiment.
Figure 2:
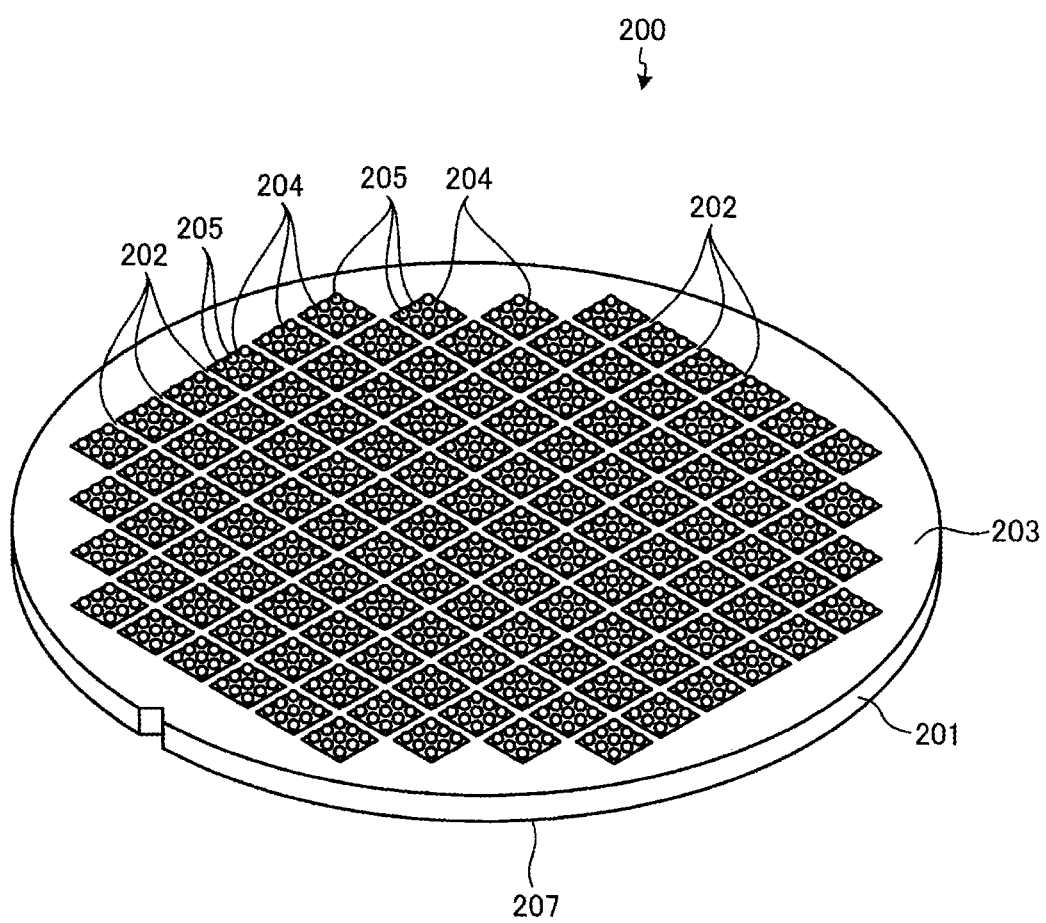
FIG. 2 is a perspective view illustrating a workpiece on which a protective component is formed by the protective component forming apparatus illustrated in FIG. 1.
Figure 3:
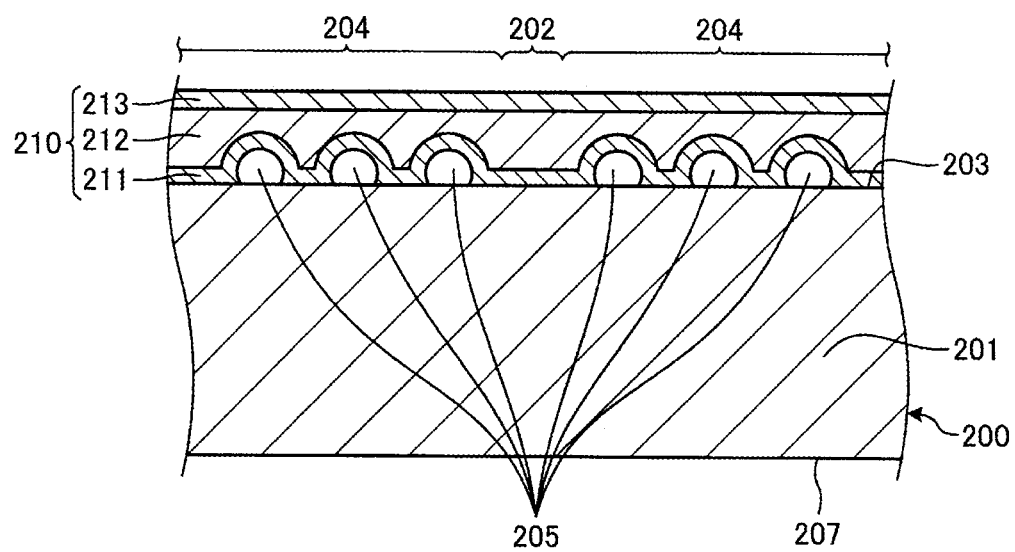
FIG. 3 is an enlarged sectional view of a major part of the workpiece illustrated in FIG. 2.
Figure 4:
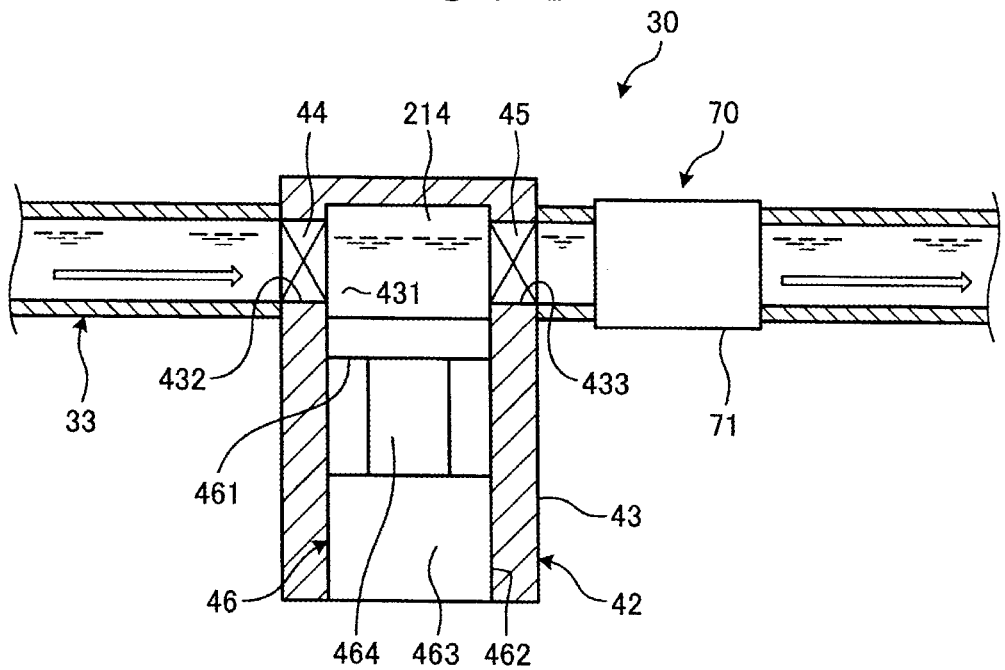
FIG. 4 is a sectional view schematically illustrating a major part of a resin supply unit of the protective component forming apparatus illustrated in FIG. 1.
Figure 5:
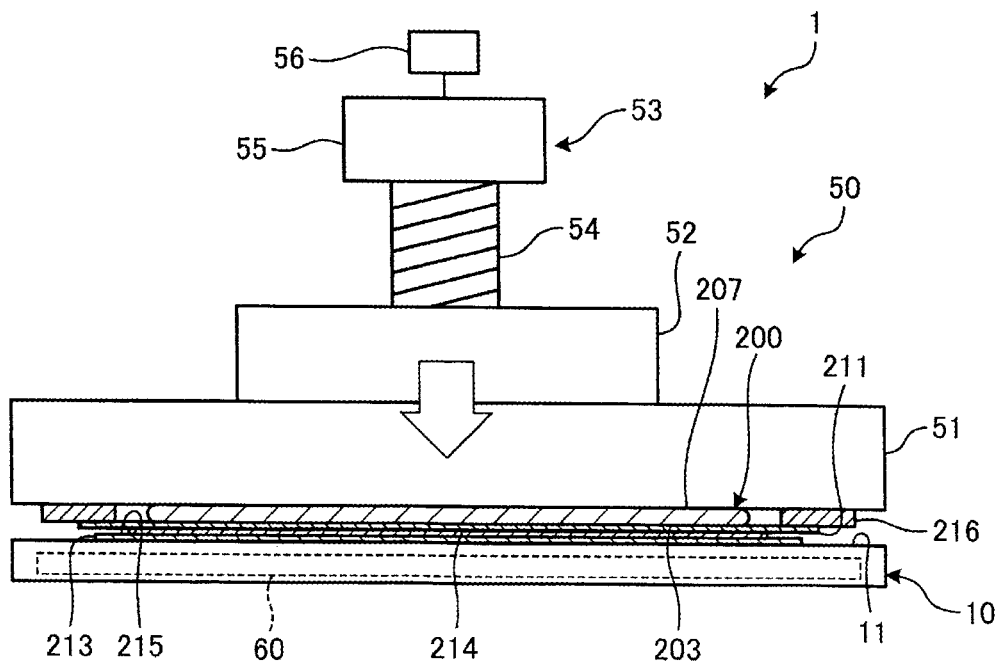
FIG. 5 is a partial sectional side view schematically illustrating a state in which a pressing unit of the protective component forming apparatus illustrated in FIG. 1 is pressing the workpiece against a liquid resin.

A protective component forming apparatus according to a first embodiment of the present invention will be described on the basis of drawings. FIG. 1 is a partial sectional side view schematically illustrating a configuration example of the protective component forming apparatus according to the first embodiment. FIG. 2 is a perspective view illustrating a workpiece on which a protective component is formed by the protective component forming apparatus illustrated in FIG. 1. FIG. 3 is a sectional view of a major part of the workpiece illustrated in FIG. 2. FIG. 4 is a sectional view schematically illustrating a major part of a resin supply unit of the protective component forming apparatus illustrated in FIG. 1. FIG. 5 is a partial sectional side view schematically illustrating a state in which a pressing unit of the protective component forming apparatus illustrated in FIG. 1 is pressing the workpiece against a liquid resin.

A protective component forming apparatus 1 illustrated in FIG. 1 according to the first embodiment is an apparatus that forms a protective component 210 that is a layer of a resin with a desired thickness and is illustrated in FIG. 3 on a front surface 203 that is one surface of a workpiece 200 illustrated in FIG. 2. The workpiece 200 on which the protective component 210 is formed by the protective component forming apparatus 1 according to the first embodiment is a wafer such as a semiconductor wafer or optical device wafer that has a circular plate shape and contains silicon (Si), sapphire ($Al_2O_3$), gallium arsenide (GaAs), silicon carbide (SiC), or the like as a substrate 201.

In the workpiece 200, as illustrated in FIG. 2, a device 204 is formed in each of the regions in the front surface 203 marked out by plural planned dividing lines 202 that intersect. As illustrated in FIG. 3, each device 204 has bumps 205 that connect to an electrode of the device 204 and protrude from the front surface 203. For example, the devices 204 are circuits such as an integrated circuit (IC) or a large scale integration (LSI), image sensors of a charge-coupled device (CCD), a complementary metal oxide semiconductor (CMOS), or the like, micro-electro-mechanical systems (MEMS), or the like. The bumps 205 are composed of an electrically-conductive metal and are formed into a spherical shape in the first embodiment.

The bumps 205 electrically connect the device 204 and an electrode of a substrate or the like on which the device 204 is mounted. In the first embodiment, recesses and protrusions are formed on the front surface 203 because the workpiece 200 has the bumps 205 that protrude from the front surface 203. Furthermore, although the workpiece 200 has the bumps 205 and the recesses and protrusions are formed on the front surface 203 in the first embodiment, the workpiece 200 does not need to have the bumps 205 in the present invention. Moreover, in the present invention, the workpiece 200 is not limited to the wafer and may be a rectangular resin package substrate, ceramic plate, glass plate, or the like having plural devices sealed by a resin.

In the first embodiment, for the workpiece 200, the protective component 210 is formed on the side of the front surface 203 and the side of a back surface 207 on the backside of the front surface 203 is ground in the state in which the side of the front surface 203 is held by a chuck table of a grinding apparatus with the interposition of the protective component 210. Thereby, the workpiece 200 is thinned to a predetermined finished thickness. After being thinned, the workpiece 200 is divided into the individual devices 204 along the planned dividing lines 202.

In the first embodiment, as illustrated in FIG. 3, the protective component 210 includes a resin film 211, a resin layer 212, and a resin sheet 213 (equivalent to the sheet) and is formed of resins of two or more layers. In the first embodiment, the resin film 211 is composed of a synthetic resin (in the first embodiment, polyolefin (PO)) that is thin and has flexibility, and is formed into a sheet shape. The resin film 211 is in close contact with the front surface 203 of the workpiece 200 and the surfaces of the bumps 205 and is stuck to them.

In the first embodiment, the resin layer 212 is composed of a liquid resin 214 (illustrated in FIG. 1) cured by being given an external stimulus and is stacked on the resin film 211. The liquid resin 214 that configures the resin layer 212 is an ultraviolet-curable liquid resin cured by being irradiated with ultraviolet as the external stimulus. However, in the present invention, the liquid resin 214 is not limited thereto and may be a liquid resin cured by being heated, for example. The liquid resin 214 is configured by ResiFlat made by DISCO Corporation or TEMPLOC made by Denka Company Limited, for example.

The resin sheet 213 is composed of a synthetic resin (in the first embodiment, polyolefin (PO)) through which ultraviolet is transmitted and that is thin and has flexibility, and is formed into a film shape. The resin sheet 213 is stacked on the resin layer 212. The resin layer 212 is configured through curing of the liquid resin 214 stacked between the resin film 211 and the resin sheet 213 by giving an external stimulus to the liquid resin 214. The combined thickness of the protective component 210 and the workpiece 200 is a thickness that is uniform across the whole of the front surface 203.

As illustrated in FIG. 1, the protective component forming apparatus 1 according to the first embodiment includes a chuck table 10, a tank 20, a resin supply unit 30, a pressing unit 50, a curing unit 60, a resin inspecting part 70, and an informing unit 103.

The chuck table 10 is formed into a circular disc shape with a larger diameter than the workpiece 200 and an upper surface 11 is flatly formed along the horizontal direction. In the chuck table 10, the resin sheet 213 that has a larger diameter than the workpiece 200 and has a circular plate shape is placed on the upper surface 11. In the chuck table 10, plural suction holes connected to a suction source that is not illustrated in the diagram are opened in the upper surface 11. Through suction of the suction holes by the suction source, the resin sheet 213 is sucked and held on the upper surface 11. Furthermore, in the first embodiment, the chuck table 10 is composed of a material having translucency, such as glass.

The tank 20 stores the liquid resin 214. In the first embodiment, the tank 20 includes a first tank 21 and a second tank 23. The first tank 21 is a container that has an opening 22 made at the upper part and internally houses the liquid resin 214. The second tank 23 is a container that has an inflow port 24 made at the upper part and a discharge port 25 made at the lower part and internally houses the liquid resin 214.

The resin supply unit 30 supplies the liquid resin 214 from the tank 20 to a front surface 215 that is one surface of the resin sheet 213 held by the chuck table 10. The resin supply unit 30 includes a pipe 31 and a pump 40.

The pipe 31 includes a supply-side pipe 32 and a discharge-side pipe 33. The supply-side pipe 32 and the discharge-side pipe 33 are pipes that allow the liquid resin 214 to pass through the inside thereof and have a cylindrical shape (in the first embodiment, circular cylindrical shape). In the supply-side pipe 32, one end connects to the opening 22 of the first tank 21 and the other end connects to the inflow port 24 made at the upper part of the second tank 23. The supply-side pipe 32 guides the liquid resin 214 in the first tank 21 into the second tank 23.

In the discharge-side pipe 33, one end connects to the discharge port 25 of the second tank 23 and the other end connects to a nozzle 34 that can face the upper surface 11 of the chuck table 10. The discharge-side pipe 33 guides the liquid resin 214 in the second tank 23 to the nozzle 34. The nozzle 34 is set to be capable of moving, by a movement mechanism that is not illustrated in the diagram, between a resin supply position at which the nozzle 34 is opposed to the center of the upper surface 11 of the chuck table 10 along the vertical direction and an evacuation position to which the nozzle 34 evacuates from above the upper surface 11 of the chuck table 10. The nozzle 34 is positioned to the resin supply position and supplies the liquid resin 214 onto the resin sheet 213 held by the upper surface 11 of the chuck table 10.

The pump 40 supplies the liquid resin 214 from the first tank 21 of the tank 20 onto the resin sheet 213 held by the upper surface 11 of the chuck table 10. The pump 40 includes a first pump 41 and a second pump 42.

The first pump 41 is set on the supply-side pipe 32 and sends out the liquid resin 214 in the first tank 21 toward the second tank 23 through the supply-side pipe 32. The second pump 42 is set on the discharge-side pipe 33 and sends out the liquid resin 214 in the second tank 23 toward the nozzle 34 through the discharge-side pipe 33.

As illustrated in FIG. 4, the second pump 42 includes a cylinder 43, a first valve 44, a second valve 45, and a piston unit 46. A space 431 is formed inside the cylinder 43, and the cylinder 43 includes an inflow port 432 and a discharge port 433 that connect to the discharge-side pipe 33. The inflow port 432 and the discharge port 433 are openings that allow the inside and outside of the cylinder 43 to communicate with each other and are opposed to each other in the first embodiment. A part of the discharge-side pipe 33 on the side of the second tank 23 connects to the inflow port 432 and the liquid resin 214 flows in from the second tank 23 into the cylinder 43 through the inflow port 432. A part of the discharge-side pipe 33 on the side of the nozzle 34 connects to the discharge port 433, and the discharge port 433 discharges the liquid resin 214 in the cylinder 43 toward the nozzle 34.

The first valve 44 is an open-close valve that is set at the inflow port 432 and opens and closes the inflow port 432. When being opened, the first valve 44 permits the liquid resin 214 to flow in from the second tank 23 into the cylinder 43 through the inflow port 432. When being closed, the first valve 44 restricts the inflow of the liquid resin 214 from the second tank 23 into the cylinder 43 through the inflow port 432. In addition, the first valve 44 restricts discharge of the liquid resin 214 in the cylinder 43 to the side of the second tank 23 through the inflow port 432.

The second valve 45 is an open-close valve that is set at the discharge port 433 and opens and closes the discharge port 433. When being opened, the second valve 45 permits the liquid resin 214 in the cylinder 43 to be discharged toward the nozzle 34 through the discharge port 433. When being closed, the second valve 45 restricts the discharge of the liquid resin 214 in the cylinder 43 toward the nozzle 34 through the discharge port 433.

The piston unit 46 includes a piston 461 disposed movably in the cylinder 43 and a cylinder 462 for driving. By moving in the cylinder 43, the piston 461 changes the volume of the space 431, i.e. the volume in the cylinder 43. The piston 461 moves in the cylinder 43 between a close position illustrated in FIG. 4 at which the piston 461 is close to the inflow port 432 and the discharge port 433 and a separate position at which the piston 461 is more separate from the inflow port 432 and the discharge port 433 than at the close position. At the close position, the piston 461 reduces the volume in the cylinder 43. At the separate position, the piston 461 enlarges the volume in the cylinder 43 compared with at the close position. The piston 461 is kept liquid-tight with the inner surface of the cylinder 43.

The cylinder 462 for driving includes a cylinder main body 463 and an extending-contracting rod 464 that can freely extend and contract from the cylinder main body 463 and has a tip to which the piston 461 is connected. The cylinder 462 for driving causes the piston 461 to move between the close position and the separate position by extending and contracting the extending-contracting rod 464 from the cylinder main body 463. In the first embodiment, the cylinder 462 for driving positions the piston 461 to the close position by extending the extending-contracting rod 464 from the cylinder main body 463 and positions the piston 461 to the separate position by contracting the extending-contracting rod 464 toward the cylinder main body 463.

The second pump 42 closes the second valve 45 and opens the first valve 44 in the state in which the piston 461 is located at the close position through extension of the extending-contracting rod 464 by the cylinder 462 for driving. Then, the cylinder 462 for driving contracts the extending-contracting rod 464 and moves the piston 461 toward the separate position to take in the liquid resin 214 into the cylinder 43 through the inflow port 432. The second pump 42 closes the first valve 44 and opens the second valve 45 in the state in which the piston 461 is located at the separate position through contraction of the extending-contracting rod 464 by the cylinder 462 for driving. Then, the cylinder 462 for driving extends the extending-contracting rod 464 and moves the piston 461 toward the close position to send out the liquid resin 214 in the cylinder 43 toward the nozzle 34 through the discharge port 433.

The pressing unit 50 causes the front surface 203 of the workpiece 200 to face the liquid resin 214 supplied to the front surface 215 of the resin sheet 213 held by the chuck table 10 and presses the workpiece 200 against the liquid resin 214. The pressing unit 50 includes a holding component 51, a rising-lowering component 52 attached to the holding component 51, and a feed unit 53.

The holding component 51 is formed into a circular disc shape with a larger diameter than the workpiece 200 and a lower surface 511 is flatly formed along the horizontal direction. In the holding component 51, plural suction holes connected to a suction source that is not illustrated in the diagram are opened in the lower surface 511. Through suction of the suction holes by the suction source, the workpiece 200 is sucked and held on the lower surface 511. In the first embodiment, the holding component 51 sucks and holds, on the lower surface 511, an annular frame 216 and the back surface 207 of the workpiece 200 for which the resin film 211 that has the outer circumferential edge to which the annular frame 216 is stuck and has a larger diameter than the workpiece 200 is in close contact with the front surface 203 and the surfaces of the bumps 205 without a gap.

The rising-lowering component 52 is fixed to the upper surface of the holding component 51, or the like. The feed unit 53 includes a ball screw 54 that is disposed in parallel to the vertical direction and is set rotatably around the axial center and is screwed to a screw hole of the rising-lowering component 52, and a motor 55 that is attached to the apparatus main body that is not illustrated in the diagram and rotates the ball screw 54 around the axial center to raise and lower the holding component 51 along the vertical direction.

The feed unit 53 also includes a well-known guide rail that is not illustrated in the diagram and is attached to the apparatus main body and supports the rising-lowering component 52 movably in the vertical Z-axis direction, and a motor control part 56 that controls power supplied to the motor 55. The motor control part 56 is what is called a motor driver that controls the power supplied to the motor 55 in accordance with a control signal from a control unit 100 of the resin inspecting part 70. The motor control part 56 is configured by a dedicated processing circuit (hardware) such as a single circuit, a composite circuit, a programmed processor, or a parallel-programmed processor.

The pressing unit 50 sucks and holds the workpiece 200 on the lower surface 511 of the holding component 51, and the feed unit 53 rotates the ball screw 54 around the axial center. Thereby, the pressing unit 50 presses the workpiece 200 held on the holding component 51 against the liquid resin 214 supplied to the front surface 215 of the resin sheet 213 held by the chuck table 10.

The curing unit 60 gives an external stimulus to the liquid resin 214 pressed by the pressing unit 50 and cures the liquid resin 214. In the first embodiment, the curing unit 60 is an ultraviolet irradiation lamp that irradiates the liquid resin 214 with ultraviolet that is the external stimulus and is installed in the chuck table 10.

The resin inspecting part 70 senses change in the viscosity in association with change in the quality regarding the liquid resin 214 that the resin supply unit 30 supplies to the front surface 215 of the resin sheet 213 held by the chuck table 10. The resin inspecting part 70 includes a measurement unit 71 and the control unit 100.

The measurement unit 71 is a flowmeter that measures the flow rate of the liquid resin 214 that flows in the discharge-side pipe 33 of the pipe 31 and is supplied to the nozzle 34 by the second pump 42 of the pump 40. In the first embodiment, the measurement unit 71 is set at a position closer to the nozzle 34 than the second pump 42 on the discharge-side pipe 33. The measurement unit 71 measure the flow rate of the liquid resin 214 and outputs the measurement value to the control unit 100. The measurement unit 71 is configured by an electromagnetic flowmeter, Karman vortex flowmeter, impeller flowmeter, float flowmeter, or thermal flowmeter.

The control unit 100 stores, in advance, an allowable range of the flow rate of the liquid resin 214 that flows in the discharge-side pipe 33 of the pipe 31 and is supplied to the nozzle 34 by the second pump 42. The allowable range is a range set in advance and is such a range of the flow rate of the liquid resin 214 flowing in the discharge-side pipe 33 that the whole of the workpiece 200 can be coated by the liquid resin 214 with a desired thickness when the workpiece 200 is pressed by the pressing unit 50.

The control unit 100 informs the operator that the measurement value of the measurement unit 71 is outside the allowable range by the informing unit 103 that transmits information when the measurement value is outside the allowable range. The control unit 100 determines whether or not the measurement value of the measurement unit 71 is outside the allowable range. When the measurement value of the measurement unit 71 is outside the allowable range, the control unit 100 causes the informing unit 103 to operate to inform the operator that the measurement value is outside the allowable range.

Furthermore, the control unit 100 controls each of the constituent elements that configure the protective component forming apparatus 1 and causes the protective component forming apparatus 1 to execute protective component forming operation to form the protective component 210 on the side of the front surface 203 of the workpiece 200. The control unit 100 is a computer that has an arithmetic processing device having a microprocessor like a central processing unit (CPU), a storing device having a memory like a read only memory (ROM) or random access memory (RAM), and an input-output interface device and can execute a computer program.

The arithmetic processing device of the control unit 100 executes a computer program stored in the ROM on the RAM and generates a control signal for controlling the protective component forming apparatus 1. The arithmetic processing device of the control unit 100 outputs the generated control signal to each of the constituent elements of the protective component forming apparatus 1 through the input-output interface device.

Moreover, the control unit 100 is connected to a display unit 101 configured by a liquid crystal display device or the like that displays the state of processing operation, an image, and so forth, an input unit 102 used when an operator registers information on the contents of processing and so forth, and the informing unit 103. The input unit 102 is configured by at least one of a touch panel disposed in the display unit 101, a keyboard, and so forth. The informing unit 103 transmits information to an operator and informs the operator by emitting at least one of sound and light. Furthermore, in the present invention, the informing unit 103 may transmit information by wired communication means or wireless communication means and notifies an operator of the information through electronic equipment such as a server or a terminal.

In the protective component forming apparatus 1 with the above-described configuration, the control unit 100 controls each of the constituent elements and executes the protective component forming operation to form the protective component 210. In the protective component forming operation, the protective component forming apparatus 1 positions the nozzle 34 of the resin supply unit 30 to the evacuation position and causes the first pump 41 to operate to supply the liquid resin 214 from the first tank 21 to the second tank 23 and store the liquid resin 214 in the second tank 23. In the protective component forming operation, the protective component forming apparatus 1 sucks and holds the resin sheet 213 on the upper surface 11 of the chuck table 10 and sucks and holds the side of the back surface 207 of the workpiece 200 and the annular frame 216 on the lower surface 511 of the holding component 51 separate from the chuck table 10.

In the protective component forming operation, the protective component forming apparatus 1 positions the nozzle 34 of the resin supply unit 30 to the resin supply position and causes the second pump 42 and so forth to operate and so forth to supply a predetermined amount of the liquid resin 214 in the second tank 23 from the nozzle 34 to the front surface 215 of the resin sheet 213. In the protective component forming operation, in the protective component forming apparatus 1, the measurement unit 71 measures the flow rate of the liquid resin 214 that flows in the discharge-side pipe 33 by the second pump 42 and the control unit 100 determines whether or not the measurement value is outside the allowable range.

In the protective component forming operation, when the control unit 100 determines that the measurement value is outside the allowable range, the protective component forming apparatus 1 causes the informing unit 103 to operate to inform the operator that the measurement value is outside the allowable range by the informing unit 103, and then stops the protective component forming operation. In the protective component forming operation, when the control unit 100 determines that the measurement value is not outside the allowable range, the protective component forming apparatus 1 positions the nozzle 34 of the resin supply unit 30 to the evacuation position and lowers, by the pressing unit 50, the workpiece 200 sucked and held on the holding component 51 to a position with which the thickness of the protective component 210 becomes a desired thickness.

Thereupon, the side of the front surface 203 of the workpiece 200 gets contact with the liquid resin 214 on the front surface 215 of the resin sheet 213 with the interposition of the resin film 211, and the liquid resin 214 is pushed and spread toward the outer circumference of the resin sheet 213 in association with the lowering of the workpiece 200. Then, when the workpiece 200 lowers to the position with which the thickness of the protective component 210 becomes the desired thickness as illustrated in FIG. 5, the liquid resin 214 gets close contact with the resin sheet 213 and the resin film 211 and coats the whole of the front surface 203 of the workpiece 200 with the interposition of the resin film 211.

In the protective component forming operation, the protective component forming apparatus 1 stops the workpiece 200 at the position with which the thickness of the protective component 210 becomes the desired thickness and causes the curing unit 60 to operate to irradiate the liquid resin 214 between the resin sheet 213 and the resin film 211 with ultraviolet from the curing unit 60 for a predetermined time. The protective component forming apparatus 1 cures the liquid resin 214 and forms the protective component 210 with the desired thickness on the front surface 203 of the workpiece 200. The protective component forming apparatus 1 stops the suction holding by the holding component 51. Thereupon, the chuck table 10 sucks and holds the workpiece 200 with the interposition of the resin sheet 213. The protective component forming apparatus 1 raises the holding component 51 by the pressing unit 50 and ends the protective component forming operation.

The protective component forming apparatus 1 according to the first embodiment described above measures the flow rate of the liquid resin 214 in the pipe 31, which varies due to change in the viscosity of the liquid resin 214, by the measurement unit 71 of the resin inspecting part 70. When the measurement value is outside the allowable range, the protective component forming apparatus 1 informs that by the informing unit 103. This allows the protective component forming apparatus 1 to suppress accidental use of the liquid resin 214 that has deteriorated (changed). As a result, the protective component forming apparatus 1 provides an effect that trouble at the time of stacking of the protective component 210 configured through stacking the liquid resin 214 can be suppressed.

Second Embodiment

Figure 6:
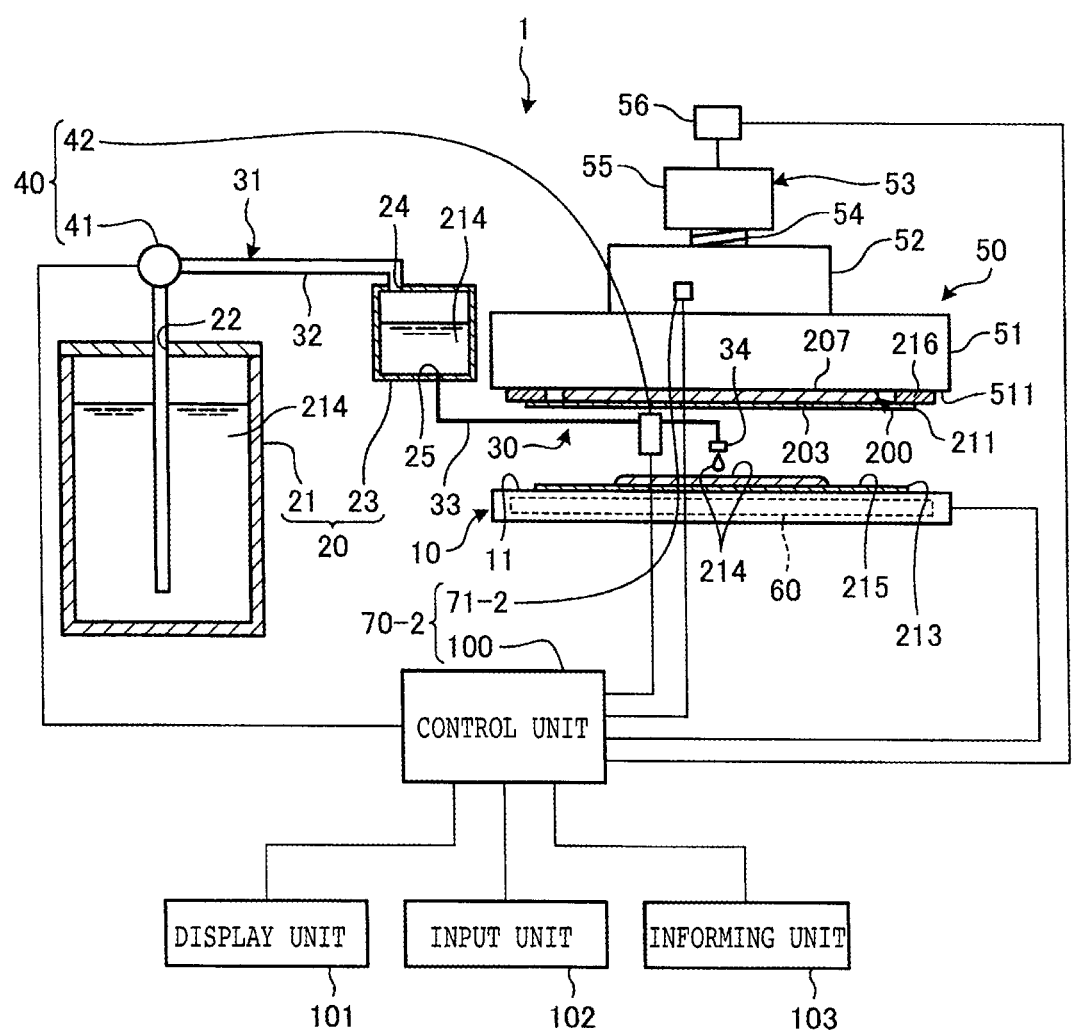
FIG. 6 is a partial sectional side view schematically illustrating a configuration example of a protective component forming apparatus according to a second embodiment.

A protective component forming apparatus according to a second embodiment will be described on the basis of a drawing. FIG. 6 is a partial sectional side view schematically illustrating a configuration example of the protective component forming apparatus according to the second embodiment. The same part as that of the first embodiment is given the same numeral in FIG. 6 and description thereof is omitted.

A protective component forming apparatus 1 according to the second embodiment is the same as the first embodiment except that a resin inspecting part 70-2 is different from the first embodiment. The resin inspecting part 70-2 of the protective component forming apparatus 1 according to the second embodiment includes a measurement unit 71-2 and the control unit 100 as illustrated in FIG. 6.

The resin inspecting part 70-2 measures the load applied to the pressing unit 50 when the pressing unit 50 lowers the workpiece 200 held on the holding component 51 and presses the liquid resin 214 by the workpiece 200. In the second embodiment, the measurement unit 71-2 is a strain gauge that is attached to the rising-lowering component 52 and measures strain according to the above-described load. In the present invention, the object to which the measurement unit 71-2 is attached is not limited to the rising-lowering component 52. The measurement unit 71-2 measures strain when the pressing unit 50 lowers the workpiece 200 held on the holding component 51 and presses the liquid resin 214 by the workpiece 200, and outputs the measurement result to the control unit 100.

The control unit 100 calculates the load applied to the pressing unit 50 from the strain that is the measurement result by the measurement unit 71-2, and determines whether or not the calculated load that is the measurement value is outside an allowable range of the load stored in advance (range of the load in which the liquid resin 214 can coat the whole of the workpiece 200 with a desired thickness when the workpiece 200 is pressed by the pressing unit 50). When the calculated load that is the measurement value is outside the allowable range, the control unit 100 causes the informing unit 103 to operate to inform the operator that the measurement value is outside the allowable range by the informing unit 103.

The protective component forming apparatus 1 according to the second embodiment measures the load applied to the pressing unit 50, which varies due to change in the viscosity of the liquid resin 214, by the resin inspecting part 70-2. When the measurement value is outside the allowable range, the protective component forming apparatus 1 informs that by the informing unit 103. Therefore, accidental use of the liquid resin 214 that has deteriorated (changed) can be suppressed. As a result, similarly to the first embodiment, the protective component forming apparatus 1 provides an effect that trouble at the time of stacking of the protective component 210 configured through stacking the liquid resin 214 can be suppressed.

Furthermore, in the present invention, the resin inspecting part 70-2 may calculate and measure the load applied to the pressing unit 50 from the load current value of the motor 55 when the holding component 51 is lowered at a constant speed.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A protective component forming apparatus that forms a layer of a resin with a desired thickness on one surface of a plate-shaped workpiece, the protective component forming apparatus comprising:
   a chuck table that holds the workpiece with interposition of a sheet;
   a tank that stores a liquid resin cured by an external stimulus;
   a resin supply unit having a pump and a pipe that supply the liquid resin from the tank to the sheet held by the chuck table;

a pressing unit that causes the one surface of the workpiece to face the liquid resin supplied to one surface of the sheet held by the chuck table and presses the workpiece;

a curing unit that gives the external stimulus to the liquid resin pressed by the pressing unit and cures the liquid resin;

a resin inspecting part that senses change in viscosity of the liquid resin in association with change in quality of the liquid resin; and an informing unit that transmits information to an operator, wherein the resin inspecting part measures a flow rate of the liquid resin that flows in the pipe by the pump using a flowmeter, and when a measurement value of the flow rate is outside an allowable range set in advance, the resin inspecting part informs that the measurement value of the flow rate is outside the allowable range by the informing unit, wherein the allowable range is a range indicating that the resin has not deteriorated during storage, and wherein the apparatus also comprises a control unit, which comprises a processor and a memory, that has stored therein the allowable range of the flow rate, and wherein the control unit is configured and arranged to determine whether or not the measurement value of the flow rate is outside of the allowable range and, when the control unit determines that the measurement value is outside of the allowable range, the control unit causes the informing unit to inform a user that the measurement value is outside of the allowable range.

2. The protective component forming apparatus according to claim 1, wherein the flowmeter comprises an electromagnetic flowmeter.

3. The protective component forming apparatus according to claim 1, wherein the flowmeter comprises a Karman vortex flowmeter.

4. The protective component forming apparatus according to claim 1, wherein the flowmeter comprises an impeller flowmeter.

5. The protective component forming apparatus according to claim 1, wherein the flowmeter comprises a float flowmeter.

6. The protective component forming apparatus according to claim 1, wherein the flowmeter comprises a thermal flowmeter.

7. The protective component forming apparatus according to claim 1, wherein the control unit comprises a microprocessor and a storing device including a memory.

* * * * *